United States Patent
Marty

(10) Patent No.: US 7,227,413 B1
(45) Date of Patent: Jun. 5, 2007

(54) AUDIO AMPLIFICATION DEVICE WITH ANTIPOP CIRCUITRY

(75) Inventor: Nicolas Marty, Fontaine (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/505,626

(22) Filed: Aug. 17, 2006

Related U.S. Application Data

(63) Continuation of application No. PCT/EP05/02365, filed on Feb. 18, 2005.

(30) Foreign Application Priority Data

Feb. 19, 2004 (FR) .................................. 04 01687

(51) Int. Cl.
*H03F 3/45* (2006.01)
(52) U.S. Cl. ...................... 330/261; 330/253; 330/257
(58) Field of Classification Search ................ 330/261, 330/253, 257; 327/535
See application file for complete search history.

(56) References Cited

U.S. PATENT DOCUMENTS

| 5,436,588 A | | 7/1995 | Ghaffaripour |
| 5,694,072 A | * | 12/1997 | Hsiao et al. ................ 327/537 |
| 5,760,647 A | * | 6/1998 | Miller et al. ................ 330/252 |
| 6,218,892 B1 | * | 4/2001 | Soumyanath et al. ....... 327/537 |
| 6,392,465 B1 | * | 5/2002 | Sauer .......................... 327/336 |
| 6,529,421 B1 | * | 3/2003 | Marr et al. ............ 365/189.09 |
| 6,542,024 B1 | | 4/2003 | Somayajula |
| 6,614,280 B1 | | 9/2003 | Panwitz |
| 6,798,285 B2 | | 9/2004 | Candy |
| 2003/0067350 A1 | | 4/2003 | Goutti et al. |

FOREIGN PATENT DOCUMENTS

WO  02/15388  2/2002

* cited by examiner

*Primary Examiner*—Patricia Nguyen
(74) *Attorney, Agent, or Firm*—Lisa K. Jorgenson; David V. Carlson; Seed IP Law Group PLLC

(57) ABSTRACT

An audio amplification device includes an input for receiving an input audio signal and an output for delivering an output audio signal and an amplifier (OA1) comprising a differential pair of MOS transistors. The gate of the first transistor is coupled to the input of the device. The gate of the second MOS transistor receives a reference voltage which takes the form of a rising ramp when the power is turned on. The drain of one of the transistors is coupled to the output. The amplifier also includes a biasing circuitry for biasing the bulk of the transistors to a first voltage level approximately equal to a supply voltage at the beginning of the reference voltage ramp, and to a second voltage level ($V_{BB}$) approximately equal to the voltage of their source at the end of the ramp. The generation of a pop is thus avoided when the power is turned on, while still benefiting from an optimum PSRR in the normal operation phase.

20 Claims, 3 Drawing Sheets

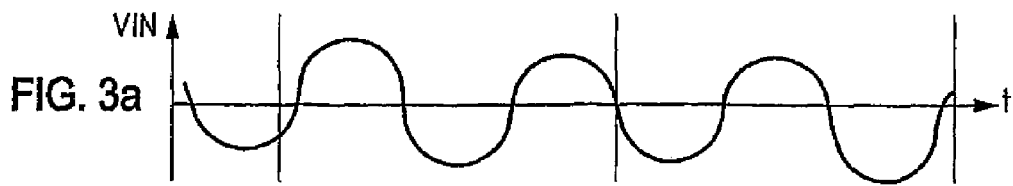
FIG. 3a
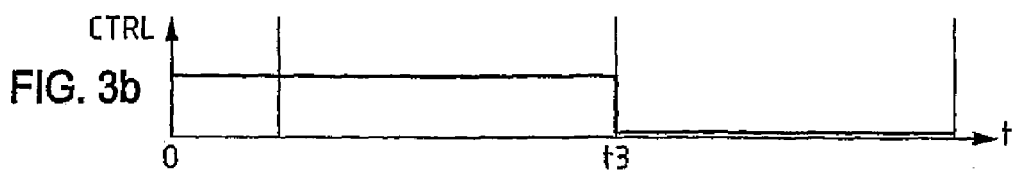
FIG. 3b
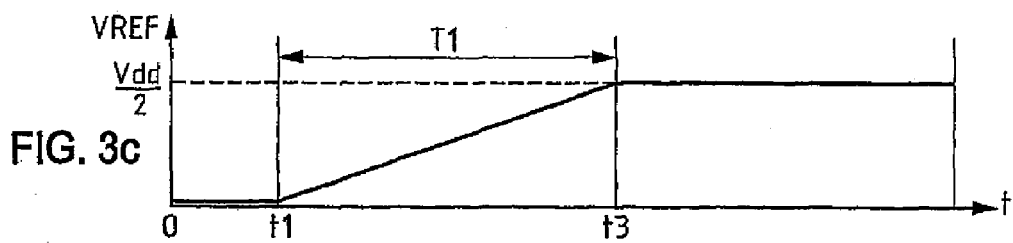
FIG. 3c
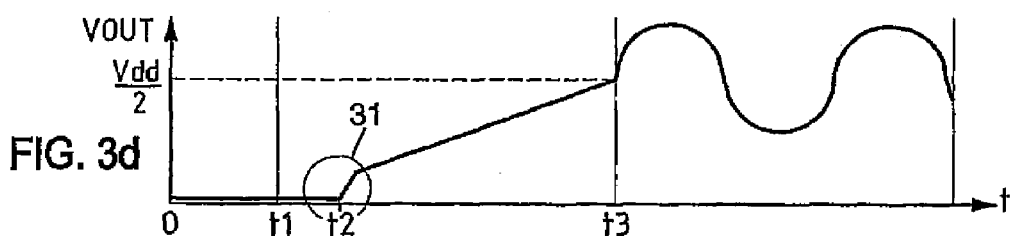
FIG. 3d
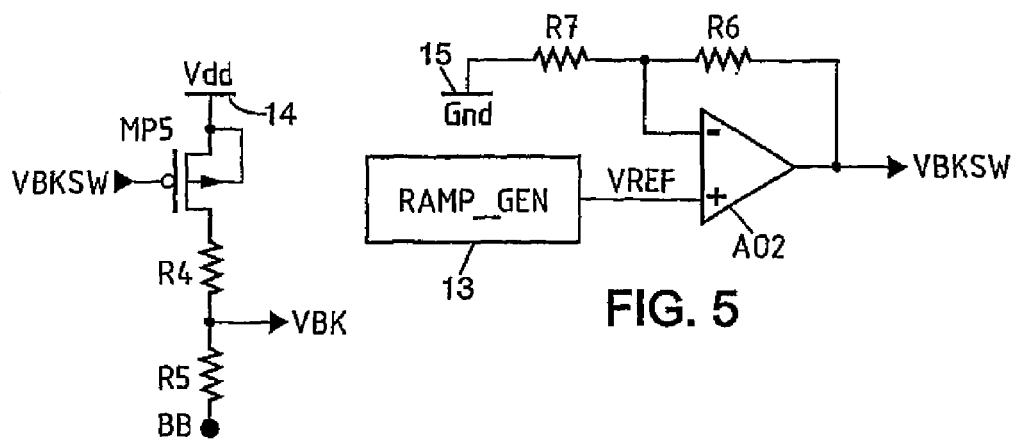
FIG. 4
FIG. 5

AUDIO AMPLIFICATION DEVICE WITH ANTIPOP CIRCUITRY

BACKGROUND OF THE INVENTION

1. Field of the Invention

The present invention relates to the amplification of audio signals. It finds applications in all audio appliances, in particular in mobile phones. In such an application, an audio amplification device is designed to drive the loudspeaker or the headphone socket of a mobile phone.

2. Description of the Related Art

Typically, an audio amplifier is biased in the mid-range of the voltages available, in other words, for example, at a reference voltage equal to Vdd/2 for an audio amplifier supplied between a positive supply voltage Vdd and ground. The maximum dynamic range is thus obtained for the amplification of an input audio signal. For example, the amplifier possesses an input stage having a differential structure which amplifies the difference between the input audio signal and the reference voltage.

When turning on the power to the audio amplifier, in order to avoid the production of an audible parasitic noise (referred to as "pop" in the jargon of those skilled in the art), it is known to incorporate circuitry called "antipop" circuitry. The function of this circuitry is to generate the reference voltage such that it takes the form of a rising ramp when the power is turned on. In addition, the application of the input audio signal is prevented until the end of the ramp. The ramp provides a smooth transition of the reference voltage between the zero voltage level and the bias voltage level Vdd/2 over a sufficiently long period (typically of the order of a hundred milliseconds) to avoid the generation of a pop. When the ramp has reached its final level, the application of the input audio signal is authorized. The output audio signal, corresponding to the amplified input audio signal, drives the loudspeaker of the appliance or the headphones plugged into the headphone socket of the appliance.

In general, the input stage of the amplifier includes a differential pair of MOS (Metal Oxide Semiconductor) transistors, for example p-type MOS (or pMOS) transistors. The gate of a first transistor of this pair is coupled to the input of the device to receive the input audio signal. The gate of the second transistor of this pair receives the reference voltage.

Generally speaking, the bulk of a pMOS transistor is usually biased at the positive supply voltage, or else it is connected to the transistor source. Here, this poses the following problem:

either the bulk of the pMOS transistors is biased at the positive supply voltage, so that the differential pair operates correctly for the values of the reference voltage closest to zero, in other words at the beginning of the ramp. In fact, owing to the bulk effect, the threshold voltages $V_T$ of PMOS transistors increase from about 0.7 V to about 0.9 V when their bulk-source voltage Vbs is equal to about 2 V. Their drain-source voltage Vds is therefore higher than 0.1 V, even at the beginning of the ramp. In this case, however, the PSRR (Power Supply Rejection Ratio) is degraded during the normal operation phase. Indeed, the amplifier gain is then more strongly dependent on the supply voltage Vdd.

or, alternatively, the bulk of the MOS transistors is biased at their source voltage, which will yield an optimum PSRR since the gain of the differential pair is now independent of Vdd. However, on powering up the amplifier, the latter will only operate when the drain-source voltage of the MOS transistors of the differential pair has reached about 0.1 V. Since the amplifier operates as a follower of the reference voltage during the power-up phase, the abrupt starting of the operation of the differential pair generates a voltage spike in the audio output signal. This voltage spike is heard as a pop and is therefore problematic.

BRIEF SUMMARY OF THE INVENTION

A first aspect of the present invention proposes an audio amplification device having an input for receiving an input audio signal and an output for delivering an output audio signal, as well as an amplifier having a differential pair of MOS transistors, with a first and a second MOS transistor each having a gate, a source, a drain and a bulk. The gate of the first MOS transistor is coupled to the input of the device. The gate of the second MOS transistor receives a reference voltage which takes the form of a rising ramp when the amplifier power is powered up. The drain of either one of the first and second MOS transistors is coupled to the output of the device. In addition, the amplifier includes biasing circuitry for biasing the bulk of the first and second MOS transistors to a first voltage at the beginning of the reference voltage ramp, and to a second voltage, different from the first voltage, at the end of the ramp. The first voltage is approximately equal to a supply voltage of the amplifier, while the second voltage is approximately equal to the common voltage of the source of the first and second MOS transistors.

Thus, the following advantages are combined: a good operation of the differential pair of MOS transistors for low values of the reference voltage (in other words, at the beginning of the ramp) which avoids the generation of a pop when the power is turned on, and a good PSRR when operating in the normal regime.

In one advantageous embodiment, the biasing circuitry provides a smooth transition of the bulk voltage of the first and second MOS transistors from the first voltage to the second voltage. This avoids the risk of a pop still being generated, which could be the case for a more abrupt transition.

Preferably, the biasing circuitry includes a ramp generator for this purpose. An effective way of providing a smooth transition is, in fact, to use a ramped switching signal.

Advantageously, the ramp generator can generate the reference voltage. Thus, the implementation of the invention does not require an additional ramp generator, since the same ramp generator is used for generating the reference voltage and for providing the smooth transition of the bulk bias voltage of the differential pair of MOS transistors.

In one embodiment, the first and second MOS transistors are pMOS transistors. In this case, the first voltage is preferably approximately equal to a positive supply voltage of the amplifier, for example the aforementioned voltage Vdd. pMOS transistors are preferred because, with n-type MOS transistors, the differential pair would not work properly until VREF had reached a value of about 0.7 V, or possibly 0.8 V.

In one embodiment, the gate of the first MOS transistor is connected to the input of the device via a controlled switch, for example an MOS transistor, which is open when the amplifier is powered up and is closed in the normal operation phase. In this way, the application of the input audio signal onto the gate of the first MOS transistor is prevented during the power-up phase. The generation of pops, originating from the audio signal itself, is thus avoided during this phase.

A second aspect of the invention relates to a method for powering up an amplifier in an audio amplification device that includes:

an input for receiving an input audio signal and an output for delivering an output audio signal; and a differential pair of MOS transistors with a first and a second MOS transistor each having a gate, a source, a drain and a bulk. The method includes the steps of:

coupling the gate of the first MOS transistor to the input of the device;

coupling the drain of either one of the first and second MOS transistors to the output of the amplifier;

applying to the gate of the second MOS transistor a reference voltage which takes the form of a rising ramp; and biasing the bulk electrode of the first and second MOS transistors to a first voltage level approximately equal to a supply voltage at the beginning of the reference signal ramp, and to a second voltage level approximately equal to the voltage of their source electrode at the end of the ramp.

A third aspect of the invention relates to an audio amplification device comprising a first MOS transistor and a second MOS transistor defining a differential pair of MOS transistors coupled to the audio input It includes a bias circuit to bias a bulk of the pair of MOS transistors to a first voltage level approximately equal to a supply voltage of the amplifier when the amplifier is in a first phase of operation, and to a second voltage level approximately equal to a voltage of their source when the amplifier is in a second phase of operation; logic provides the differential pair of MOS transistors an audio input signal to be amplified only after the differential pair of MOS transistors is biased to the second voltage level.

A fourth aspect comprising a sound reproduction device; and an audio amplification device according to the first aspect, including an output for delivering an output audio signal suitable for driving the sound reproduction device.

BRIEF DESCRIPTION OF THE SEVERAL VIEWS OF THE DRAWINGS

Further features and advantages of the invention will become apparent upon reading the description that follows. This is purely illustrative and is to be read with reference to the appended drawings in which:

FIGS. 3a to 3d are timing diagrams illustrating the operation of the audio amplification device in FIGS. 1 and 2 without the teaching of the present invention;

FIGS. 4 and 5 illustrate one embodiment of a bulk biasing circuitry for the differential pair of MOS transistors shown in FIG. 2.

DETAILED DESCRIPTION OF THE INVENTION

Figure 1:
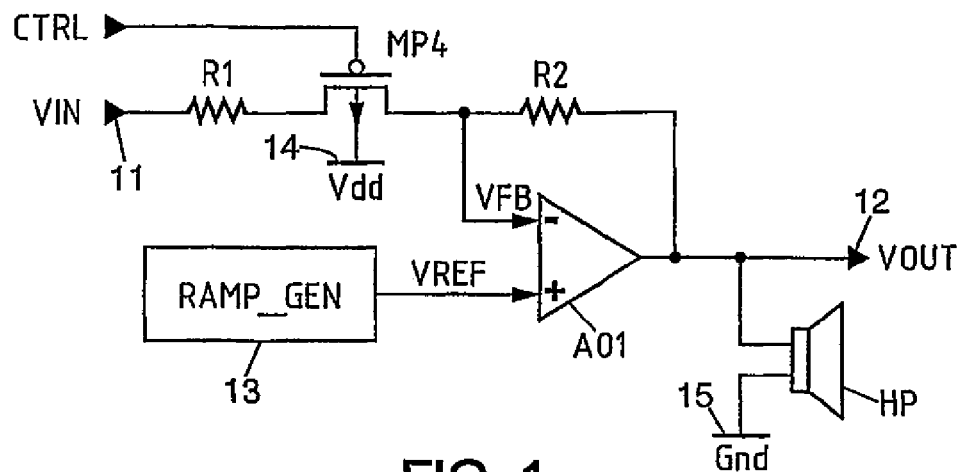
FIG. 1 is a functional circuit diagram of an example of an audio amplifier to which the present invention may be applied.

In FIG. 1, a schematic circuit diagram is shown of an example of an audio amplification circuit to which the present invention may be applied.

The audio amplification circuit includes an input 11 for receiving an audio input signal VIN to be amplified. It also includes an output 12 delivering an audio output signal VOUT corresponding to the signal VIN after amplification. The signal VOUT is a signal suitable for driving a sound reproduction device such as a loudspeaker or headphones. Typically, the output 12 drives a loudspeaker of the appliance in which the audio amplification circuit is used, or a headphone socket of this appliance to which a pair of headphones or earphones or, alternatively, an external loudspeaker can be connected. In the case depicted here, a loudspeaker HP is shown connected in parallel between the output 12 and a ground terminal 15 having a ground potential Gnd.

In the present description, all the voltages mentioned are referenced to the ground potential Gnd.

The amplification circuit includes an amplifier AO1, for example a differential amplifier such as an operational amplifier. This type of amplifier includes an input stage with a differential pair of transistors. Here, the transistors are MOS transistors. The device is, for example, fabricated using CMOS (Complementary MOS) technology. The detailed circuit diagram of the input stage of the amplifier AO1 will be presented below with reference to FIG. 2.

In one example, the inverting terminal of the amplifier AO1 is coupled to the input 11 via a resistor R1 and a pMOS transistor (reference MP4) which is configured as a controlled switch. For this purpose, the gate of the transistor MP4 receives a control signal CTRL. For example, the bulk electrode of the transistor MP4 is connected to a positive supply terminal 14 delivering a positive supply voltage Vdd.

The output of the amplifier AO1 is coupled to the terminal 12 and delivers the signal VOUT. In addition, the output of the amplifier AO1 is connected to its own inverting input via a resistor R2.

The feedback signal received by the inverting input of the amplifier AO1 is denoted VFB.

The non-inverting terminal of the amplifier AO1 receives a reference signal VREF delivered by a ramp generator 13. In one example, the signal VREF allows the amplifier AO1 to be biased at the voltage Vdd/2, where Vdd denotes a positive supply voltage of the amplifier AO1, with a ramp when power is applied to the amplifier circuit.

The following relation applies:

$$VOUT-VREF=-R2/R1\times(VIN-VREF) \qquad (1)$$

In other words, the gain of the device is equal to $-R2/R1$. In one example, the resistors R1 and R2 both have the same value, for example 10 kΩ. Thus, when the switch MP4 is closed (signal CTRL in the 0 state), the amplifier AO1 operates as a voltage inverter, the gain being equal to $-1$. It will be noted that, when the switch MP4 is open (signal CTRL in the 1 state), the amplifier AO1 operates as a voltage follower. In fact, the voltage VOUT follows the voltage VREF.

Figure 2:
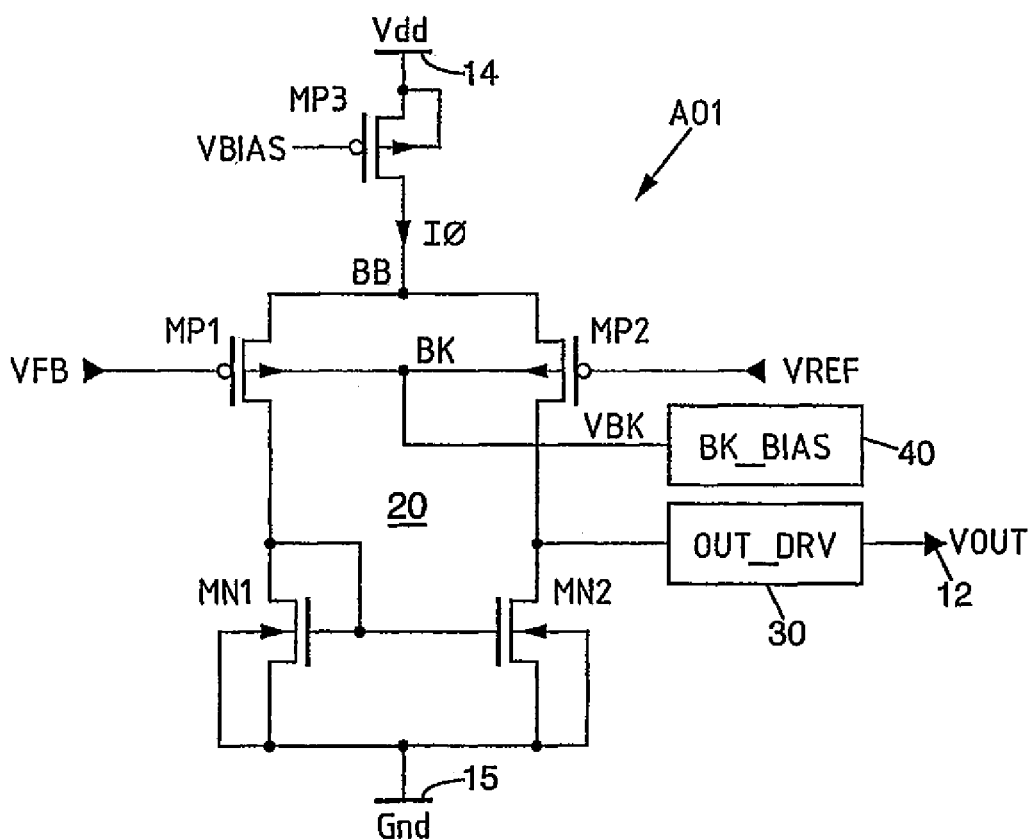
FIG. 2 is a detailed circuit diagram of an input stage of an audio amplification device to which the present invention may be applied, comprising a differential pair of MOS transistors.

FIG. 2 shows a detailed embodiment of an input stage 20 of the amplifier AO1.

The input stage 20 includes here a differential pair of MOS transistors comprising two transistors, for example pMOS transistors MP1 and MP2, respectively, configured as a differential pair.

The sources of the transistors MP1 and MP2 are connected together at a node BB. A current source MP3, delivering a constant current I0, is inserted between the positive supply terminal 14 delivering the positive supply voltage Vdd on one side, and the node BB on the other. In an example considered here, the positive supply voltage Vdd is equal to about 3.6 V.

For example, the current source is in the form of a pMOS transistor whose bulk electrode, being connected to the terminal 14, has a voltage Vdd. The gate of the transistor MP3 receives a constant bias voltage VBIAS whose amplitude determines the value of the current I0. The means for generating the voltage VBIAS are not described in detail here, since they are within the competence of those skilled in the art.

The drain of the transistor MP1 is connected to ground via an n-type MOS (nMOS) transistor MN1, which is configured as a diode (in other words, its drain is connected to its gate). Similarly, the drain of the transistor MP2 is connected to ground via an nMOS transistor MN2, whose gate is connected to the gate of the transistor MN1. In other words, the transistors MN1 and MN2 are connected in opposing-current mode. The bulk electrodes of the transistors MN1 and MN2, being connected to the terminal 15, are at ground potential.

The drains of the transistors MP2 and MN2 are coupled to the output 12 delivering the signal VOUT. In one example, they are connected to the output 12 through a power output stage 30 (OUT_DRV). Such a stage, whose detailed circuit diagram is not given here, includes, for example, at least one pair of complementary MOS transistors. The function of the output stage 30 is to provide an output current, capable of driving the load connected to the output terminal 12, for the signal VOUT. The description of an embodiment of the stage 30 would be outside of the scope of the present description, especially as this type of stage is well known to those skilled in the art.

As a variant, the transistor MN2 may be configured in diode mode instead of the transistor MN1. In this case, it is the drains of the transistors MP1 and MN1 that are coupled to the output 12 instead of those of the transistors MP2 and MN2. The gain will then be inverted.

The gate of the transistor MP1, which forms the inverting input of the amplifier AO1, receives the signal VFB. Similarly, the gate of the transistor MP2, which forms the non-inverting input of the amplifier AO1, receives the reference voltage VREF.

The bulk electrodes of the transistors MP1 and MP2 are connected together at a node BK.

In principle, the node BK is permanently connected to the node BB, in other words a bias voltage equal to the voltage of their common source is applied to the bulk electrodes of the transistors MP1 and MP2. In this manner, a good PSRR is obtained but the input stage 20 operates poorly at power-up, owing to the fact that the drain-source voltage Vds of the transistor MN1 is equal to the gate-source voltage Vgs of the transistor MP2.

This phenomenon will now be described with reference to the timing diagrams in FIGS. 3a to 3d, in order to provide a better understanding of the teaching of the invention.

In FIG. 3a, an example of an input audio signal VIN is shown as a function of time. For simplicity, here the signal VIN is a pure sine wave. In practice, the frequency spectrum of the signal VIN is generally wider. Furthermore, also for simplicity, the signal VIN has a DC component that is zero.

In FIG. 3b, the control signal CTRL is shown as a function of time. It is recalled that this signal is the signal that controls the opening or closing of the switch MP4, in other words the operation in follower mode or the operation in inverter mode, respectively, of the amplifier AO1. When the amplifier power is turned on, which occurs at the initial time t=0, the signal CTRL has a value 1. The switch MP4 is therefore open and the amplifier AO1 operates as a follower of the voltage VREF. At a later time t3, the signal CTRL changes state to 0. The switch MP4 is then closed and the amplifier AO1 operates as an inverter of the voltage VIN, while also introducing a DC component corresponding to the voltage VREF into the signal VOUT.

The timing diagram in FIG. 3c shows the behaviour of the reference voltage VREF as a function of time. It is recalled that the voltage VREF is generated by a ramp generator, so that it takes the form of a relatively slowly rising ramp when the amplifier power is turned on. At the initial time t=0, the signal VREF has a value of zero. At a given later time t1, the signal VREF begins to increase smoothly until it reaches the desired bias voltage level, for example Vdd/2, which happens at a given time t3. In other words, between times t1 and t3 the signal VREF takes the form of a rising ramp between zero volts and the desired bias voltage level. This ramp rise may be relatively slow, in other words the period T1 separating times t1 and t3 could be relatively long, for example around 100 ms. After time t3, the signal VREF maintains the value Vdd/2.

In FIG. 3d, the behaviour of the output signal VOUT is shown as a function of time. From the initial time to time t3, the amplifier AO1 operates as a voltage follower. Nevertheless, up to a time t2 at which the voltage VREF reaches about 0.1 V, the voltage VOUT remains at zero. This comes from the fact that the transistors MP1 and MP2 are not in a correct operation regime. In fact, pMOS transistors do not function correctly when their drain-source voltage is below about 0.1V or 0.2V.

More precisely, the voltage Vds of the transistors MN1 and MN2 should be greater than about 0.7 V, and on the other the voltage Vds of the transistors MP1 and MP2 should be above about 0.1 V.

Now, the following relations apply:

$$V_{BB} = Vds(MN2) + Vds(MP2) = VREF + Vt(MP2) \quad (2)$$

where $V_{BB}$ denotes the voltage at the node BB;

Vds (MN2) denotes the voltage Vds of the transistor MN2;

Vds (MP2) denotes the voltage Vds of the transistor MP2; and

Vt (MP2) denotes the threshold voltage Vt of the transistor MP2.

Therefore, the voltage $V_{BB}$ should be equal to at least about 0.7+0.1=0.8 V, which is not the case when VREF is equal to zero (at the beginning of the ramp) with a threshold voltage Vt of the transistors MP1 and MP2 equal to about 0.7 V.

At time t2, the transistors MP1 and MP2 suddenly start to operate, and the voltage VOUT abruptly recovers to the level reached by the voltage VREF at this time. In other words, at time t2 the signal VOUT exhibits a step between 0 and 0.1 V (or 0.2 V, respectively). In FIG. 3d, this step is ringed by a circle 31. Between time t2 and t3, the voltage VOUT then follows the voltage VREF.

At time t3, the voltage VOUT has reached the desired bias voltage level (in the example, Vdd/2). The signal CTRL now becomes zero closing the switch MP4. The amplifier AO1 now functions in voltage inverter mode. This is the reason why the AC component of the signal VOUT now corresponds to the inverse of the signal VIN. Its DC component is equal to the bias voltage Vdd/2.

One drawback is that the spike 31 in the signal VOUT gives rise to a pop in the audio signal, and this pop can be heard by the user.

As a remedy to this drawback, one embodiment is to connect, in a permanent fashion, the bulk electrode of the transistors MP1 and MP2 to a bias voltage higher than the voltage of the node BB, for example to the positive supply voltage Vdd. Thus, the threshold voltage of the transistors MP1 and MP2 would then increase from about 0.7 V to about 0.9 V because of the 'body effect' (for Vbs equal to about 2 V), such that the voltage $V_{BB}$ would be equal to about 0.9 V as soon as the amplifier power is turned on. Thus, since the voltage $V_{BB}$ is equal to the sum of the Vds voltages of the transistors MN1 and MP1, or MN2 and MP2, a Vds voltage of the transistors MN1 and MN2 could be greater than about 0.7 V and a Vds voltage of the transistors MP1 and MP2 could be greater than about 0.1 V.

Therefore, the device would operate well right from the beginning of the VREF voltage ramp. Nevertheless, the PSRR in the normal operation regime would then be very degraded. Indeed, the gain of the amplifier would then be dependent on the positive supply voltage Vdd. This is a real problem for noisy power supplies as is the case with a mobile phone in communication.

The invention solves these problems by providing a dynamic biasing for the bulk of the differential pair of transistors MP1 and MP2 of the input stage 20 of the amplifier AO1. More particularly, the bulk electrode of the transistors MP1 and MP2 is brought to a voltage level approximately equal to the voltage Vdd at the beginning of the VREF signal ramp, and at a voltage approximately equal to the voltage $V_{BB}$ of the node BB at the end of this ramp.

A schematic circuit diagram of a dynamic biasing circuitry 40 (BK_BIAS) for the bulk of the transistors MP1 and MP2 which achieves this is illustrated in FIGS. 4 and 5. The function of this circuitry 40 is to generate a suitable voltage VBK, which is applied to the node BK of the input stage 20 of the amplifier AO1. The voltage VBK has a value approximately equal to the voltage Vdd at the beginning of the VREF signal ramp and to the voltage of the node BB at the end of this ramp.

The transition of the voltage VBK between these initial and final values may have any kind of profile. Nevertheless, it is preferable that the circuitry 40 provide a smooth transition (i.e. without jumps), in order to avoid the generation of pops. Such a smooth transition can be obtained thanks to the charging behaviour of a capacitor which provides an exponential-type transition with a given time constant.

In addition, the presence in the audio amplification circuit of a ramp generator designed to generate the reference voltage VREF can be used to advantage.

The circuitry 40 includes two stages, namely an input stage and an output stage.

An output stage of the circuitry 40 is shown in FIG. 4. This stage includes, between the positive supply terminal and the node BB, a pMOS transistor MP5, a resistor R4 and a resistor R5, in that order. In other words, the source of the transistor MP5 is connected to the positive supply terminal 14, and its drain is connected to a first terminal of the resistor R4, whose other terminal is connected to the node BB via the resistor R5.

The common node between the resistors R4 and R5 delivers the voltage VBK. In other words, the resistors R4 and R5 form a potential divider and, moreover, the current flowing in this divider bridge is controlled by the transistor MP5. The bulk electrode of the transistor MP5 is connected to its source. The gate of the transistor MP5 receives a switching signal VBKSW which is generated by the input stage of the circuitry 40.

In one example, the values of the resistors R4 and R5 are equal to 20 kΩ and 180 kΩ, respectively. With these values, the initial value (maximum voltage, at the beginning of the ramp) of the voltage VBK is equal to around 3 V, for Vdd equal to 3.6 V. In other words, the voltage drop ΔV across the terminals of the resistor R4 is relatively small (around 0.5 V) when the transistor MP5 is conducting, owing to the relatively high value of the resistor R5 (note that the voltage Vds of the transistor MP5 in the conducting state is of the order of 0.1 V). The final value (minimum voltage, at the end of the ramp) of the voltage VBK is approximately equal to the voltage $V_{BB}$ at the node BB, which is typically equal to VREF+Vt.

One embodiment of the input stage of the circuitry 40 is shown as a schematic circuit diagram in FIG. 5.

The function of this input stage is to generate the switching signal VBKSW which drives the output stage of the circuitry 40, which has been described heretofore with reference to the circuit diagram in FIG. 4. In order to provide a smooth transition between the initial and final values of the bulk bias voltage of the transistors MP1 and MP2, a ramp generator is used in this stage.

Advantageously, this would be the ramp generator 13 already used for generating the reference voltage VREF (FIG. 1). In other words, the signal VBKSW is generated from the voltage VREF. This embodiment is especially advantageous because it avoids the necessity for a second ramp generator. Nevertheless, depending on the application, it may be preferable to have two separate ramp generators. Furthermore, other ways of obtaining a smooth transition can also be envisaged. For example, the signal VBKSW may be generated from an RC network with a given time constant, where the smooth transition is then obtained from the charging (or the discharging) of a capacitor, which is exponential in form, rather than using a voltage ramp.

Another advantage of generating the signal VBKSW from the voltage VREF is that the beginning of the transition of the signal VBKSW is synchronized with the beginning of the VREF voltage ramp. In other words, the signal VBKSW takes off from its initial value, which here is zero meaning that the transistor MP5 of the input stage is conducting, approximately exactly at time t1 when the rising ramp of the voltage VREF starts.

In the embodiment considered here, the output stage of the circuitry 40 includes a differential amplifier AO2, for example an operational amplifier. The inverting terminal of the amplifier AO2 receives the voltage VREF delivered by the generator 13. The inverting terminal of the amplifier AO2 is connected to its output via a resistor R6 on the one hand, and to the ground terminal 15 via a resistor R7 on the other. The output of the amplifier AO2 delivers the switching signal VBKSW. The following relation then holds:

$$VBKSW = (1 + R6/R7) \times VREF \qquad (3)$$

In one example, the value of the resistor R6 is equal to 40 kΩ and the value of the resistor R7 is equal to 10 kΩ. The gain of the output stage of the circuitry 40 is therefore equal to 5.

Given the numerical values chosen in the embodiment hereinabove, the signal VBKSW will reach the saturation voltage of the amplifier AO2, in other words the voltage Vdd, at a time t2', which is earlier than time t3 that corresponds to the end of the VREF voltage ramp.

Figure 6A:
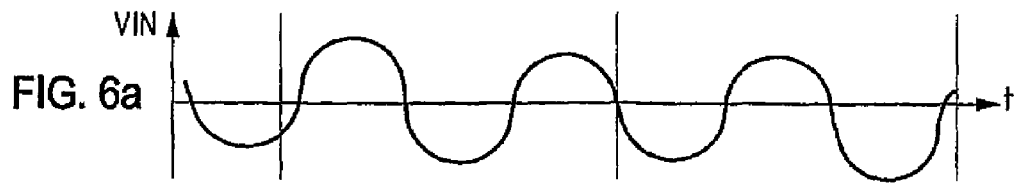
FIGS. 6a to 6f are timing diagrams illustrating the operation of the audio amplification device of FIGS. 1 and 2 with the teaching according to the present invention.
Figure 6B:
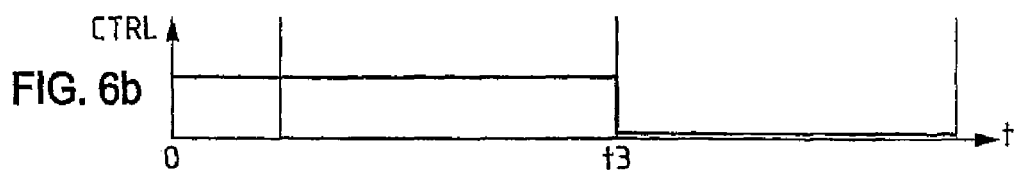
Figure 6C:
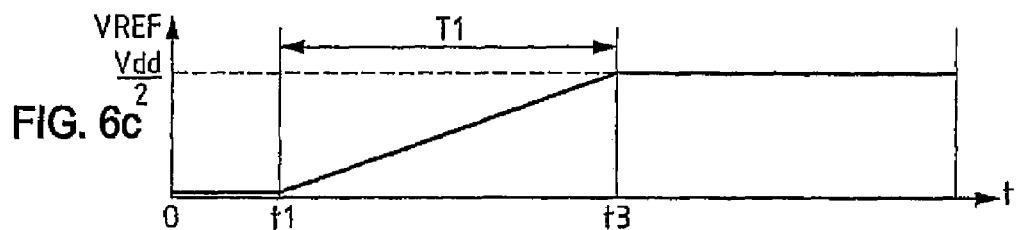

The operation of the amplification device, in the embodiment of the present invention described hereinabove, is illustrated by the timing diagrams in FIGS. 6a to 6f. The voltages and signals shown in the FIGS. 6a, 6b, 6c and 6f are identical to those shown in FIGS. 3a, 3b, 3c and 3d, respectively. The first three pairs of figures are identical, one for one, so that FIGS. 6a, 6b and 6c are not described a second time.

Figure 6D:
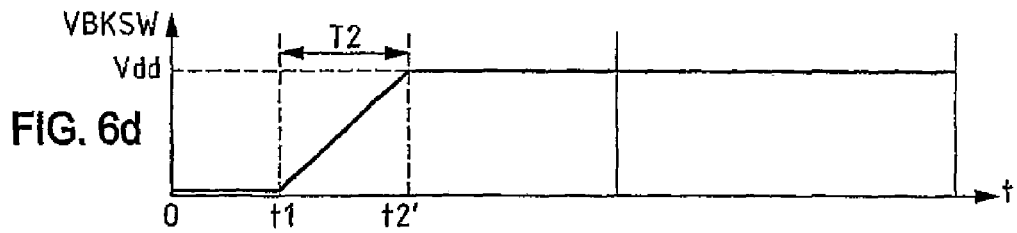

FIG. 6d shows the switching signal VBKSW as a function of time. As can be seen, this signal goes from zero volts to the voltage Vdd through a smooth transition, in this case a rising ramp. More precisely, the signal VBKSW has a value of zero between the initial time t=0 and time t1 at which the VREF voltage ramp begins. After a period T2 following the time t1, which duration T2 is shorter than the duration T1 of the VREF voltage ramp, the signal VBKSW reaches the value Vdd. This happens at the aforementioned time t2', which is earlier than the time t3 corresponding to the end of the VREF voltage ramp. In fact, since the amplifier AO2 is powered by the voltage Vdd, the output signal VBKSW that it generates is saturated at this voltage value Vdd when the voltage VREF exceeds around 0.9 V, namely 3.6 V divided by the gain R6/R7 which is 4 in the example.

The smooth transition of the signal VBKSW between the values 0 and Vdd causes a smooth transition of the bias voltage VBK between a value approximately equal to the voltage Vdd (to within the voltage Vds of the transistor MP5 as well as the voltage drop ΔV across the terminals of the resistor R4) and a voltage approximately equal to the voltage at the node BB (to within the voltage drop across the terminals of the resistor R5 which is theoretically zero when, at the end of the ramp, the transistor MP5 is turned off).

Figure 6E:
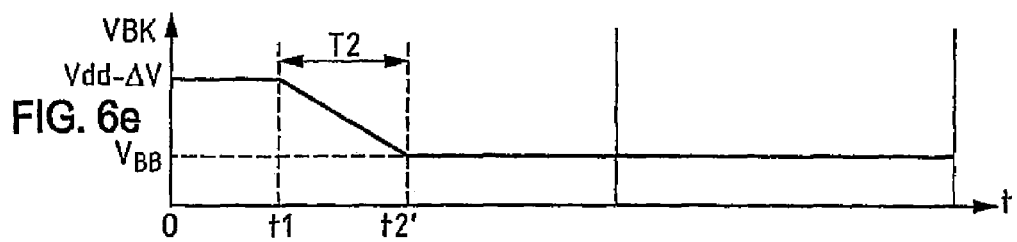

The bias voltage VBK is shown in FIG. 6e as a function of time.

Figure 6F:
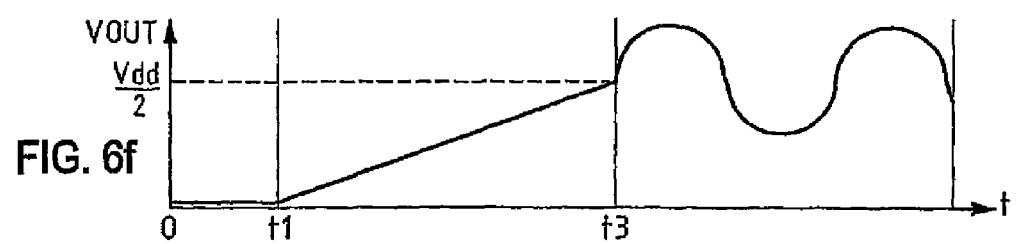

Here, the output voltage VOUT shown in FIG. 6f differs from the voltage VOUT shown in FIG. 3d in that it exhibits no spike during the power-up phase which extends between times t1 and t3. In fact, between these two times, the voltage VOUT rises smoothly from zero to the voltage Vdd/2 since the transistors MP1 and MP2 of the differential pair of the amplifier AO1 function correctly even for low values of the voltage VREF.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. An audio amplification device comprising:
   an input for receiving an input audio signal and an output for delivering an output audio signal;
   an amplifier including a differential pair of MOS transistors, with a first and a second MOS transistor each having a gate, a source, a drain and a bulk;
   wherein:
      the gate of the first MOS transistor is coupled to the input of the device;
      the gate of the second MOS transistor receives a reference voltage which takes the form of a rising ramp when the amplifier is powered up;
      the drain of either one of the first and second MOS transistors is coupled to the output of the device; and
      the amplifier additionally includes biasing circuitry for biasing the bulk of the first and second MOS transistors to a first voltage level approximately equal to a supply voltage of the amplifier at the beginning of the reference voltage ramp, and to a second voltage level approximately equal to the voltage of their source at the end of the ramp.

2. The device according to claim 1 wherein the biasing circuitry provides a smooth transition of the bulk voltage of the first and second MOS transistors from the first voltage to the second voltage.

3. The device according to claim 2 wherein the biasing circuitry comprises a ramp generator.

4. The device according to claim 3 wherein the ramp generator generates the reference voltage.

5. The device according to claim 1 wherein the first and second MOS transistors are p-type MOS transistors, and in which the first voltage is approximately equal to a positive supply voltage of the amplifier.

6. The device according to claim 1, wherein the gate of the first MOS transistor is connected to the input of the device via a controlled switch which is open when the amplifier is powered up and is closed in the normal operation phase.

7. A method for powering up an amplifier in an audio amplification device which comprises:
   an input for receiving an input audio signal and an output for delivering an output audio signal; and
   a differential pair of MOS transistors with a first and a second MOS transistor each having a gate, a source, a drain and a bulk;
   the method including the steps of:
      coupling the gate of the first MOS transistor to the input of the device;
      coupling the drain of either one of the first and second MOS transistors to the output of the amplifier;
      applying to the gate of the second MOS transistor a reference voltage which takes the form of a rising ramp; and
      biasing the bulk electrode of the first and second MOS transistors to a first voltage level approximately equal to a supply voltage of the amplifier at the beginning of the reference voltage ramp, and to a second voltage level approximately equal to the voltage of their source at the end of the ramp.

8. The method according to claim 7 wherein a smooth transition of the bulk voltage of the first and second MOS transistors from the first voltage to the second voltage is provided.

9. The method according to claim 8 wherein the smooth transition is obtained by means of a ramp generator.

10. The method according to claim 9 wherein the ramp generator generates the reference voltage.

11. A method of amplifying an audio signal comprising:
   applying a selected voltage signal to a gate of a first MOS transistor, said first MOS transistor being one transistor of a differential pair of MOS transistors each MOS transistor in the pair having a gate, a source, a drain, and a bulk;
   increasing the voltage of said voltage signal in the shape of a rising ramp;
   biasing the bulk of the differential pair of transistors to a first voltage level approximately equal to a supply voltage of the amplifier circuit at the lower voltage level of the rising ramp, and to a second voltage level approximately equal to a voltage of their source at a higher voltage level of the rising ramp.

12. The method of claim 11 where the supply voltage of the amplifier is Vdd.

13. The method of claim 11 where the supply voltage of the amplifier is Vss.

14. An audio amplification device comprising:
an audio input;
a first MOS transistor and a second MOS transistor defining a differential pair of MOS transistors coupled to the audio input;
a bias circuit that biases a bulk of the pair of MOS transistors to a first voltage level approximately equal to a supply voltage of the amplifier when the amplifier is in a first phase of operation, and to a second voltage level approximately equal to a voltage of their source when the amplifier is in a second phase of operation; and
logic that provides to the differential pair of MOS transistors an audio input signal to be amplified, only after the differential pair of MOS transistors is biased to the second voltage level.

15. The audio amplification device of claim 14 wherein the means for biasing the bulk of the pair of MOS transistors further comprises voltage ramp generating circuitry.

16. The audio amplification device of claim 14 wherein the biasing means includes circuitry configured to dynamically bias voltage applied to the bulk of the pair of MOS transistors as a rising ramp from the first phase of operation to the second phase of operation.

17. The audio amplification device of claim 16 wherein the circuitry configured to bias the bulk of the pair of MOS transistors comprises
a third MOS transistor configured to be dynamically switched, having a gate coupled to the bulk of the first and second MOS transistor, and configured to maintain a smooth transition through the threshold voltage of the pair of MOS transistors as the differential pair of transistors are biased from the first phase of operation to the second phase of operation.

18. The audio amplification device of claim 14 wherein, the first phase of operation is defined as beginning when power is first applied to the biasing means and ends when the second voltage level is achieved.

19. The audio amplification device of claim 14 wherein, the second phase of operation is defined as beginning when the second voltage reaches a desired level.

20. The audio amplification device of claim 14 further comprising:
a housing that holds the audio input, the differential pair of MOS transistors and the bias circuit;
a visual display coupled to the housing;
a key pad for a mobile phone coupled to the housing; and
a speaker coupled to the housing and to the differential pair of MOS transistors to provide the audio application output from mobile phone.

* * * * *